United States Patent
Wouters et al.

(10) Patent No.: US 7,897,952 B2
(45) Date of Patent: Mar. 1, 2011

(54) PHASE-CHANGE MEMORY CELL WITH A PATTERNED LAYER

(75) Inventors: Dirk Wouters, Heverlee (BE); Ludovic Goux, Hannut (BE); Judith Lisoni, Our-Heverlee (BE); Thomas Gille, Leuven (BE)

(73) Assignee: NXP B.V., Eindhoven (NL)

( * ) Notice: Subject to any disclaimer, the term of this patent is extended or adjusted under 35 U.S.C. 154(b) by 102 days.

(21) Appl. No.: 11/914,638

(22) PCT Filed: May 18, 2006

(86) PCT No.: PCT/IB2006/051576

§ 371 (c)(1),
(2), (4) Date: Sep. 23, 2009

(87) PCT Pub. No.: WO2006/123306

PCT Pub. Date: Nov. 23, 2006

(65) Prior Publication Data

US 2010/0001248 A1 Jan. 7, 2010

Related U.S. Application Data

(60) Provisional application No. 60/683,030, filed on May 19, 2005.

(51) Int. Cl.
*H01L 47/00* (2006.01)
*G11C 11/00* (2006.01)

(52) U.S. Cl. ............ 257/2; 257/E47.001; 257/E45.002; 365/163

(58) Field of Classification Search ............ 257/2, 257/4, 296, E47.001, E21.068, E45.002; 438/102, 103, 466, 467; 365/163
See application file for complete search history.

(56) References Cited

U.S. PATENT DOCUMENTS

| | | | |
|---|---|---|---|
| 7,061,013 B2 | 6/2006 | Hideki | |
| 7,387,938 B2 | 6/2008 | Hideki | |
| 7,750,431 B2 | 7/2010 | Hideki | |
| 2004/0164290 A1* | 8/2004 | Yi et al. | 257/4 |
| 2005/0167645 A1* | 8/2005 | Kim et al. | 257/2 |
| 2007/0072125 A1* | 3/2007 | Sousa et al. | 430/270.13 |

FOREIGN PATENT DOCUMENTS

FR 2861887 * 5/2005

* cited by examiner

*Primary Examiner*—Thomas L Dickey
*Assistant Examiner*—Nikolay Yushin

(57) ABSTRACT

A phase-change-material memory cell is provided. The cell comprises at least one patterned layer of a phase-change material, and is characterized in that this patterned layer comprises at least two regions having different resistivities. If the resistivity of the phase-change material is higher in a well-defined area with limited dimensions ("hot spot") than outside this area, then, for a given current flow between the electrodes, advantageously more Joule heat will be generated within this area compared to the area of the phase-change material where the resistivity is lower.

13 Claims, 4 Drawing Sheets

| PC-Layer | metal contact |
| heat cond. Layer | heat-sink |

PHASE-CHANGE MEMORY CELL WITH A PATTERNED LAYER

The invention relates to a phase change memory cell.

Standard Phase Change Memory (PCM) lateral/line type cell are designed with a geometrical constriction in the form of an hourglass pattern of the structure, as described in a paper by Martijn H. R. Lankhorst, Bas W. S. M. M. Ketelaars And R. A. M. Wolters., "Low-cost and nanoscale non-volatile memory concept for future silicon chips", Nature Materials, (Published online: 13 Mar. 2005), and a paper by P. Haring Bolívar, F. Merget, D.-H. Kim, B. Hadam and H. Kurz, "Lateral design for phase change random access memory cells with low-current consumption", EPCOS-2004 conference (see:www.epcos.org/pdf_2004/19paper_haringbolivar.pdf). As shown in FIG. 1, the current I will flow between the outer contacts or electrodes, here composed of an Al, WTi/TiN stack, through a central part formed in the phase-change material. This shape of the memory cell results in a local increase of the current density and hence in an increased heat generation due the Joule effect. During the device operation, this constricted area with the highest current density will be the first to melt.

Instead of reducing the cross-sectional area of the central part by reducing the width W thereof as shown in FIG. 1, a constriction in vertical direction, as disclosed in the Haring Bolívar paper, can be obtained by using a local thinning of the PCM layer thereby locally reducing the thickness t of the phase-change material.

The problem is that with scaling down the dimensions, both methods for geometrically confining the first-to-melt region are prone to process variations. The control of the geometry of the hourglass shape of FIG. 1 becomes more difficult. FIG. 2 shows the rounding effect due to lithographic processing generation causing the dimensions of the processed memory cell to deviate from the dimensions of the cell as-designed. The continuous line defines the cell as-designed, while the dashed line corresponds to the perimeter of the cell after lithographic patterning. This change in geometry and the spread thereon will result in larger variations of cell characteristics. The approach whereby the phase-change film thickness is reduced by etch as described in the Haring Bolívar paper is also not a well controlled process and will add to the variation.

There is a need for a more controllable method to form a phase-change-memory cell having a well-defined region of limited dimensions ("hot spot") resulting in a local increase of the current density during operation in this hot spot.

According to a first aspect of the invention there is provided a phase-change-material memory cell comprising at least one patterned layer of a phase-change material, characterized in that this patterned layer comprises at least two regions having different resistivities. If the resistivity of the phase-change material is higher in a well-defined area with limited dimensions ("hot spot") than outside this area, then, for a given current flow between the electrodes, advantageously more Joule heat will be generated within this area compared to the area of the phase-change material where the resistivity is lower.

The at least one patterned layer may consist of a central region inbetween two outer regions and wherein the resistivity of this central region is higher than the resistivity of the two outer regions.

According to a second aspect of the invention there is provided a method for manufacturing a memory cell comprising at least one patterned layer of a phase-change material, characterized in that this patterned layer comprises at least two regions having different resistivities, the method comprising:

forming a patterned layer of a phase-change-material having a first resistivity; and, creating a difference in resistivity between at least two regions within this patterned layer.

Embodiments of the present invention will now be described, by way of example only, with reference to the accompanying drawings, in which.

Figure 1A:
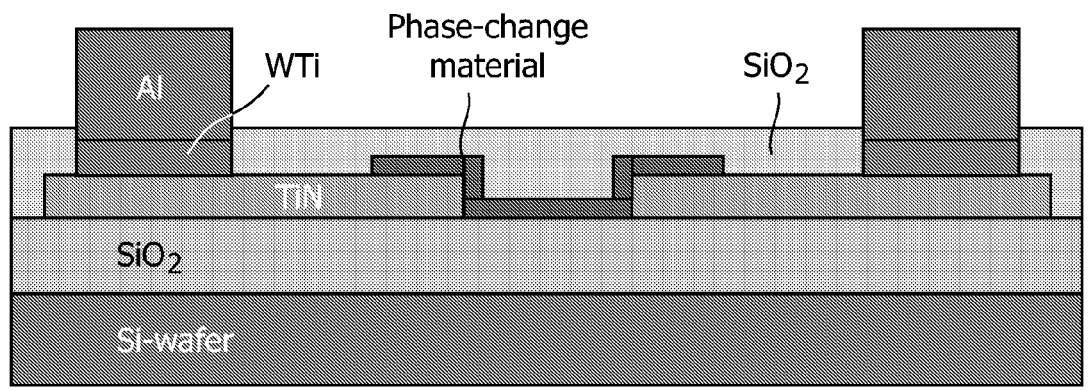
FIG. 1A shows a schematic cross-section and scanning electron micrograph of an example type of a PCM line cell with TiN contacts and Al bond-pads processed on a silicon wafer.
Figure 1A:
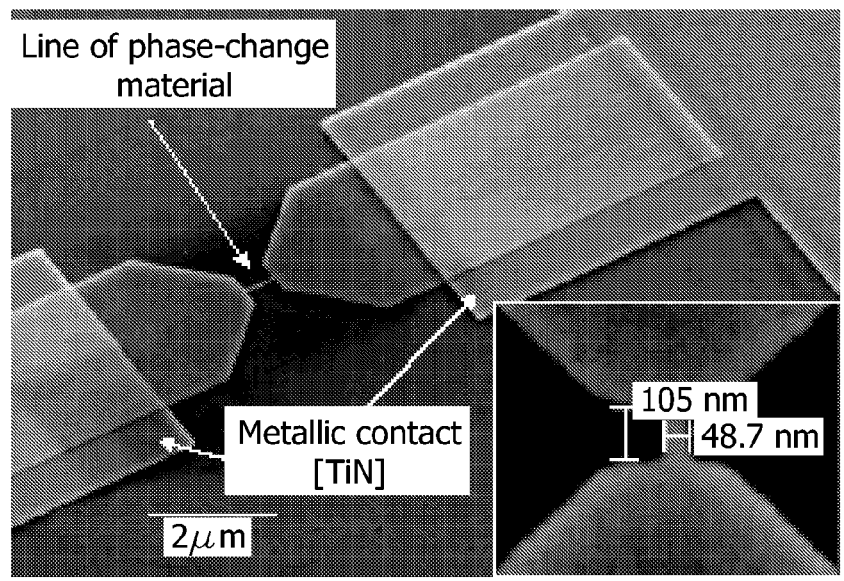
Figure 1B:
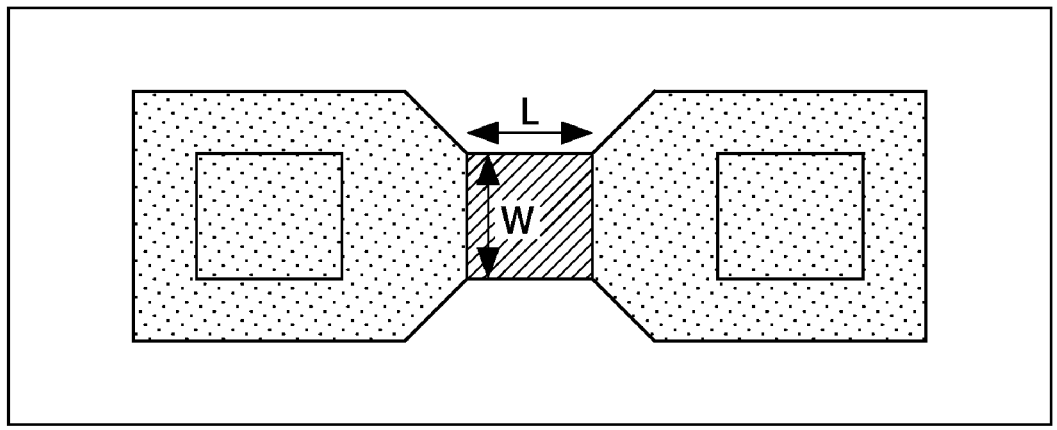
FIG. 1B shows a schematic cross-section and plan view of an example type of a PCM line cell.
Figure 1B:
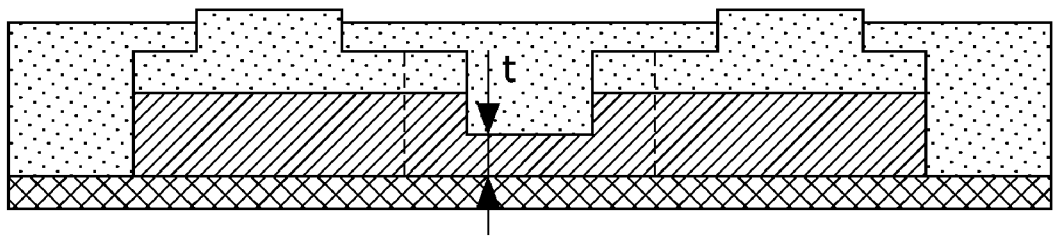
Figure 2:
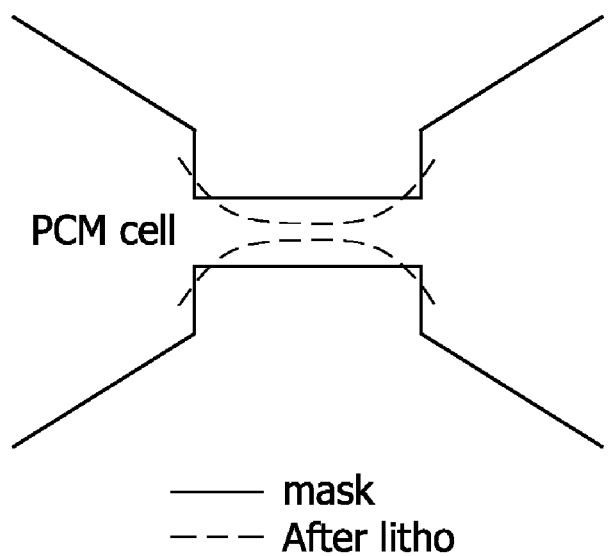
FIG. 2 shows a schematic plan view of part of a PCM cell.
Figure 3:
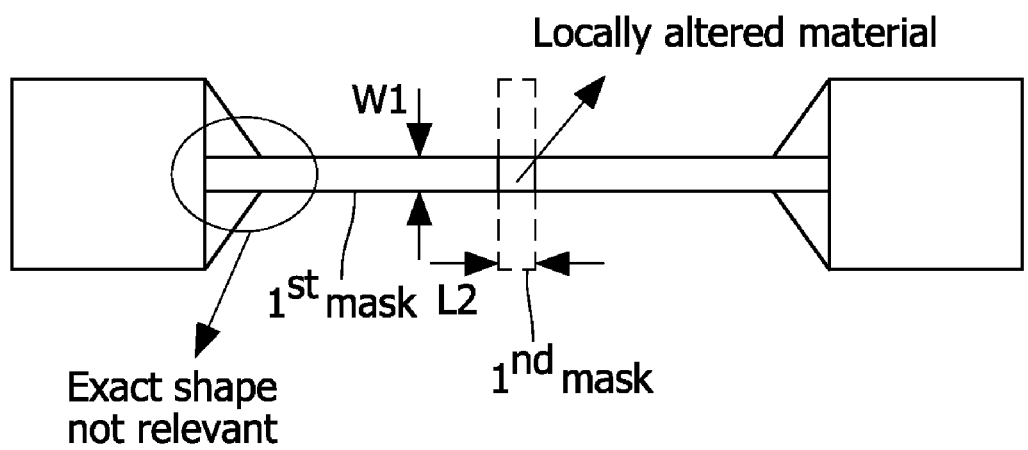
FIG. 3 shows a schematic plan view of part of a PCM cell during manufacture in accordance with one embodiment of the invention.

The process in accordance with the invention can be implemented as follows. Geometrically a long line cell is made first (FIG. 3) by depositing a layer of a phase-change material (PCM) and subsequently patterning this layer. This layer may be patterned in the form of an hour-glass shape similar to the structures shown in FIG. 1. Alternatively, a hardmask, such as a TiW layer, can be used to pattern this layer. Such a hardmask is formed over the PCM layer and patterned. In turn, the patterned hardmask is used to pattern the underlying first PCM layer. As shown in FIG. 3, the width W1 of the first mask used to pattern to PCM layer is critical from a process standpoint, as it is the smallest dimension to be controlled.

In a second step, the material properties of the PCM layer are locally changed using a second mask. The material in this area should have an increased resistivity compared to the non-altered material, without substantially changing the PCM properties of the PCM layer. For the resistivity-altering step the width L2 of the second mask is critical from process point of view as it is the smallest dimension to be controlled. The dimensions of the active area ("hot spot") where the resistivity is the highest may be defined using two lithographic process steps, where the first step defines the active area dimension W1 in a direction perpendicular to the length of the line cell, while the second step defines the active area dimension L2 along the length. As the total resistance of this active area is determined by its dimensions as well as by its resistivity, a trade-off can be made between a lower limit for obtainable dimensions in a given technology and an upper limit of the obtainable resistivity for a given phase-change material.

Figure 4:
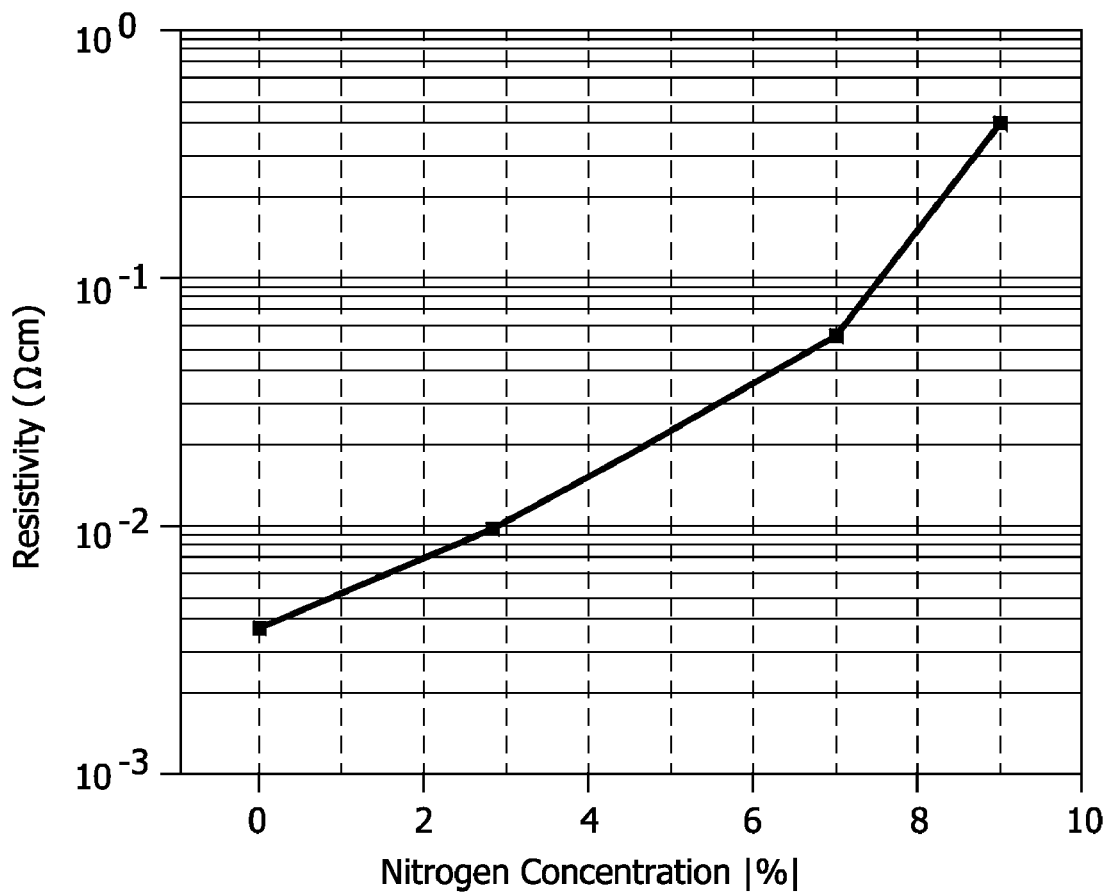
FIG. 4 is a plot of the resistivity of the GST films as a function of nitrogen concentration.

Various ways exist to change the resistivity in the active area. The phase-change material can be locally nitridated, e.g. by implantation of nitrogen ions or by exposure to a nitrogen containing plasma. Using nitride-doping, the resistivity of GST material can be increased by up to 2 orders of magnitude, as is illustrated in the graph shown in FIG. 4. This increased resistivity will result in an increase in Joule dissipation in the nitrogen-doped area, and melting will start first in this area due to its higher resistivity.

Other implementations may include implantation with other elements, e.g., metals that form part of the desired PCM material compound. The desired composition of the phase-change material is only obtained essentially in the active area, with the composition of the phase-change material outside the active area being characterized by a lower resistivity as compared to the modified phase-change material in the active area.

Figure 5:
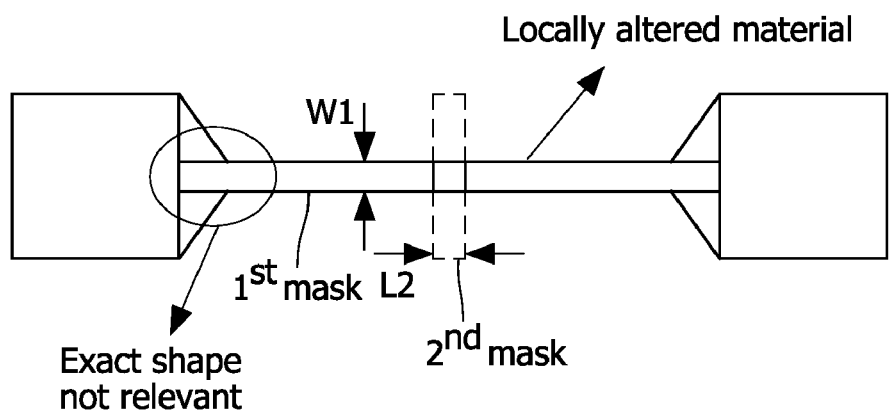
FIG. 5 shows a schematic plan view of part of a PCM cell during manufacture in accordance with another embodiment of the invention.

As an alternative to locally increasing the resistivity of the phase-change material, e.g., in the active area shown in FIG. 3, the resistivity of the phase-change material outside this active area could be decreased, as is illustrated in FIG. 5. In both cases, the difference in resistivity between the active area and the remaining part of the phase-change material will result in a difference in the amount of heating for a given current. Consequently, within the active area, the re-crystallization or melting temperature of the phase-change material will be reached first causing this "hot spot" to melt first.

The invention claimed is:

1. A phase-change-material memory cell comprising at least one patterned layer of a phase-change material, characterized in that this patterned layer comprises at least two regions having different resistivities in a common phase.

2. The memory cell of claim 1, wherein the at least one patterned layer consists of a central region in-between two outer regions and wherein the resistivity of this central region is higher than the resistivity of the two outer regions.

3. The memory cell of claim 1, wherein one of the at least two regions has a higher resistivity and is configured to undergo a phase change via current-induced heating at a rate that is higher than that of the other one of the regions having a lower resistivity.

4. The memory cell of claim 1, wherein one of the at least two regions has a higher resistivity and is configured to reach a phase-change re-crystallization temperature via current-induced heating, prior to the other one of the regions reaching the re -crystallization temperature, in response to a current applied to the respective regions.

5. A memory circuit comprising:
a layer of a phase-change material; and
within the layer,
a low resistivity region, and
a high resistivity region configured to heat to a phase transition temperature in response to a current applied thereto, at a rate that is higher than the low resistivity region heats in response to the current, such that the high resistivity region is configured to undergo a phase change prior to the low resistivity region in response to a current applied to the patterned layer.

6. The circuit of claim 5, wherein the low resistivity region is at outer regions of the layer of phase-change material and the high resistivity region is a central region between the outer regions.

7. The circuit of claim 5, wherein the high resistivity region is configured to reach a re-crystallization temperature via current-induced heating, prior to the low resistivity region reaching the re-crystallization temperature, in response to a current applied to the layer of phase-change material.

8. A method for manufacturing a memory cell, the method comprising:
forming a patterned layer of a phase-change-material having a first resistivity; and,
creating a difference in resistivity between at least two regions within this patterned layer, the at least two regions having the same phase.

9. The method of claim 8, wherein creating the difference in resistivity includes increasing the resistivity in one region, relative to the first resistivity.

10. The method of claim 9, wherein increasing the resistivity in the one region includes increasing the resistivity in a central region in-between two outer regions.

11. The method of claim 8, wherein creating a difference in resistivity between at least two regions includes increasing the resistivity of one of the regions to a higher resistivity to configure the region to undergo a phase change via current-induced heating at a rate that is higher than a corresponding rate of heating of the other one of the regions.

12. The method of claim 8, wherein creating a difference in resistivity between at least two regions includes creating one of the at least two regions with a higher resistivity to configure the region to reach a phase-change re-crystallization temperature via current - induced heating, prior to the other one of the regions reaching the re-crystallization temperature, in response to a current applied to the respective regions.

13. The method of claim 8, wherein creating a difference in resistivity between at least two regions includes decreasing the resistivity of one of the regions to a lower resistivity to configure the region to undergo a phase change via current-induced heating at a rate that is lower than a corresponding rate of heating of the other one of the regions.

* * * * *